United States Patent [19]

Toda et al.

[11] Patent Number: 4,862,106

[45] Date of Patent: Aug. 29, 1989

[54] SIGNAL GENERATING APPARATUS USING PLL CIRCUIT

[75] Inventors: Kouichi Toda; Masaaki Hashizu, both of Tokyo, Japan

[73] Assignee: Anritsu Corporation, Tokyo, Japan

[21] Appl. No.: 183,827

[22] Filed: Apr. 20, 1988

[30] Foreign Application Priority Data

Apr. 20, 1987 [JP] Japan ................................ 62-95079

[51] Int. Cl.[4] ................................................ H03L 7/00

[52] U.S. Cl. ............................................ 331/2; 331/25

[58] Field of Search ................... 331/2, 16, 17, 18, 25; 307/529; 455/260

[56] References Cited

FOREIGN PATENT DOCUMENTS 0073141 6/1980 Japan .................................... 331/25

OTHER PUBLICATIONS

"Frequency Synthesizers Theory and Design", Second Edition; Vadim Manassewitsch-Engineering Consultant; Wiley-Interscience Publication; John Wiley & Sons, pp. 98–100.

*Primary Examiner*—Eugene R. LaRoche
*Assistant Examiner*—Robert J. Pascal
*Attorney, Agent, or Firm*—Frishauf, Holtz, Goodman & Woodward

[57] ABSTRACT

A PLL circuit includes a reference signal generator, a phase detector, a voltage controlled oscillator (VCO), a mixer, and a local oscillator. The VCO generates a signal having a desired frequency within a predetermined frequency bandwidth. A switch is connected between an output terminal of the phase detector, an output terminal of the mixer, and an input terminal of the VCO. The switch performs a switching operation to connect the output terminal of the phase detector to the input terminal of the VCO in a first state, and, in a second state, to connect the output terminal of the mixer to the input terminal of the VCO. A controller is connected to the switch so as to selectively supply first and second switching signals to the switch and establish connection relationships corresponding to the first and second states. The controller substantially determines a coincidence state between a frequency of an output signal from the VCO and a frequency of a local oscillation signal from the local oscillator, so as to generate the first switching signal for establishing the connection relationship corresponding to the first state, when a determination result representing a predetermined coincidence is not obtained, and to generate the second switching signal for establishing the connection relationship corresponding to the second state, when the determination result representing the predetermined coincidence is obtained.

10 Claims, 6 Drawing Sheets

| | | | | | | | | | | | |
|---|---|---|---|---|---|---|---|---|---|---|---|
| fv (MHz) | 520 TO 570 | 570 TO 620 | 620 TO 670 | 670 TO 720 | 720 TO 770 | 770 TO 820 | 820 TO 870 | 870 TO 920 | 920 TO 970 | 970 TO 1020 | 1020 TO 1070 |
| frl (MHz) | 50 | 100 | 150 | 200 | 250 | 300 | 350 | 400 | 450 | 500 | 550 |
| n | 1 | 2 | 3 | 4 | 5 | 6 | 7 | 8 | 9 | 10 | 11 |

F I G. 2 (PRIOR ART)

| fv (MHz) | 520 TO 570 | 570 TO 620 | 620 TO 670 | 670 TO 720 | 720 TO 770 | 770 TO 820 | 820 TO 870 | 870 TO 920 | 920 TO 970 | 970 TO 1020 | 1020 TO 1070 |
|---|---|---|---|---|---|---|---|---|---|---|---|
| fr1 (MHz) | 250 | 200 | 150 | 100 | 50 | 0 | 50 | 100 | 150 | 200 | 250 |
| n | (−)5 | (−)4 | (−)3 | (−)2 | (−)1 | 0 | 1 | 2 | 3 | 4 | 5 |
| SWICH 17 | Ⓘ | Ⓘ | Ⓘ | Ⓘ | Ⓘ | (II) | Ⓘ | Ⓘ | Ⓘ | Ⓘ | Ⓘ |
| fL | fL = fv + fr1 | | | | | fL = fv | fL = fv − fr1 | | | | |
| | (n≠0)(−): LSB (fr2) | | | | | (n=0) | (n≠0)(+): USB (fr2) | | | | |

F I G. 4

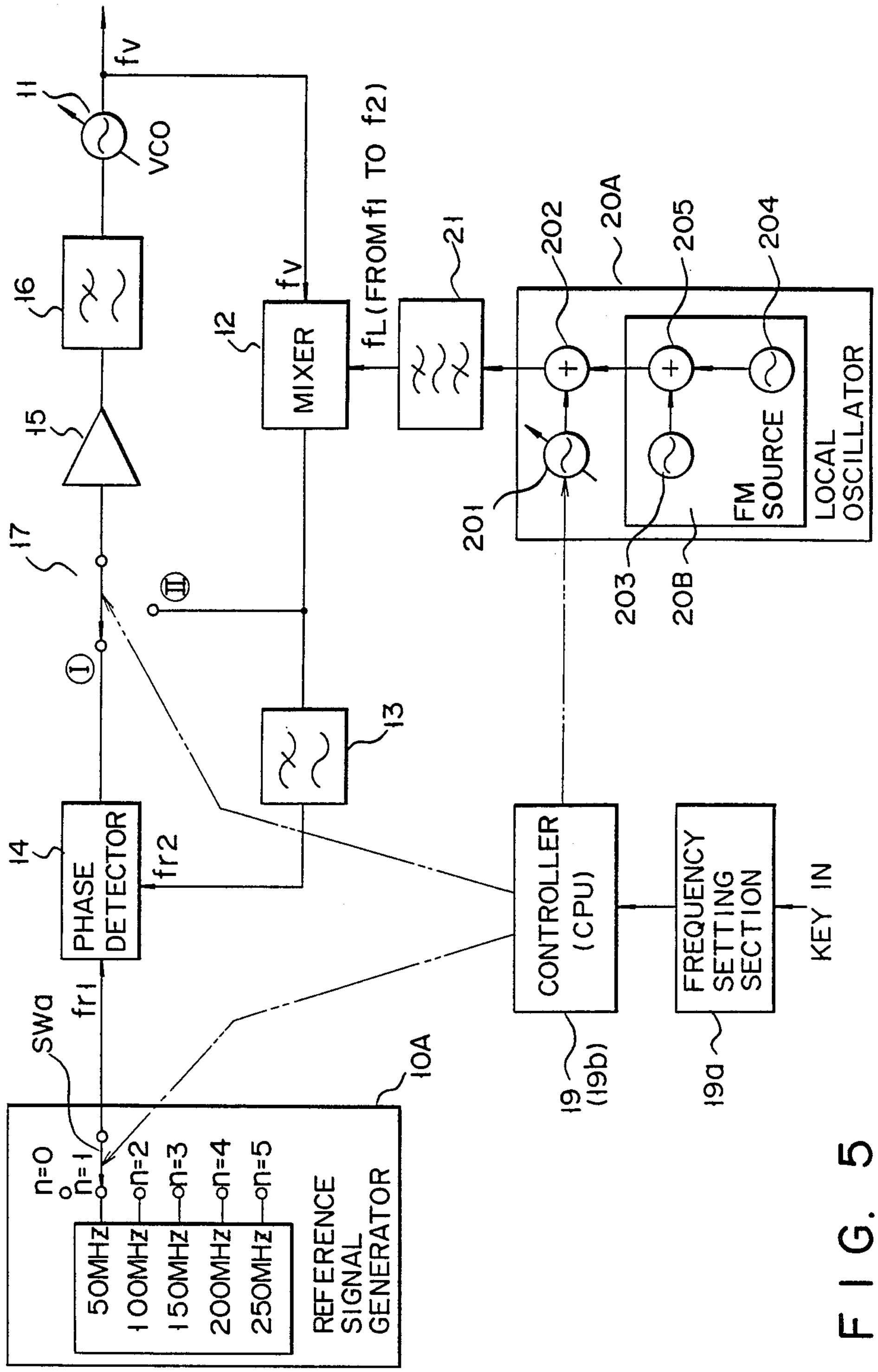
F I G. 5

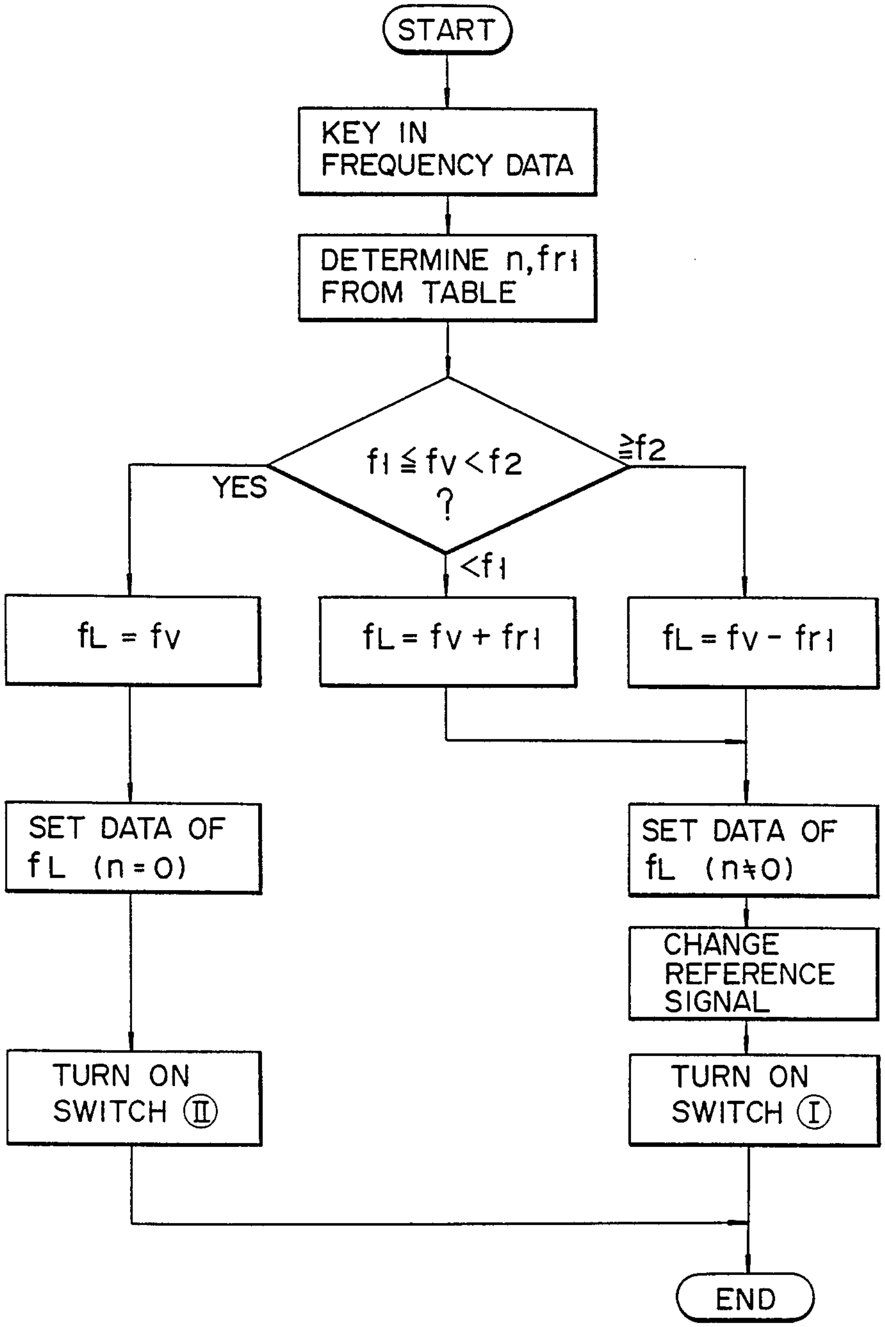
F I G. 6

SIGNAL GENERATING APPARATUS USING PLL CIRCUIT

BACKGROUND OF THE INVENTION

1. Field of the Invention

This invention relates to a signal generating apparatus and, more particularly, to a signal generating apparatus using a phase locked loop (PLL) circuit for causing a voltage controlled oscillator (VCO) included in the PLL circuit to generate, in a series of steps, and in a substantially continuous manner, signals having desired frequencies within a predetermined frequency bandwidth.

2. Description of the Related Art

A signal generating apparatus which uses a PLL circuit is an example of a known conventional signal generating apparatus which can generate signals in the manner described above.

FIG. 1 shows an example of this type of conventional signal generating apparatus in which an output signal from voltage controlled oscillator 11, contained in the PLL circuit, and a local oscillation signal (frequency fL) from local oscillator 20 are mixed with each other by mixer 12, and the resulting composite signal is fed back to phase detector 14 through low-pass filter 13. In phase detector 14, the phases of the composite signal having frequency fr2 and a reference signal having frequency fr1 ($=n\times\Delta f$) (to be referred to hereinafter simply as composite signal fr2 and reference signal fr1) are compared with each other, and as a result of this comparison, a DC voltage signal corresponding to the phase difference is supplied to voltage controlled oscillator 11, through DC amplifier 15 and loop filter 16, this DC voltage signal controlling the oscillation frequency of voltage controlled oscillator 11. In this way, a signal having desired frequency fv ($=fL+fr1$) is generated from voltage controlled oscillator 11.

In the case described above, reference signal fr1 is a high-precision signal supplied from reference signal generator 10. Reference symbol n denotes a frequency index of a reference signal; and Δf, a fixed frequency between indexes. For example, when signals are to be generated within the frequency bandwidth of 520 to 1,070 MHz, each value is set as n=1 to 11 and Δf=50 MHz.

In the case described above, the generation of a 520-MHz signal will be described below.

When a frequency of 520 MHz is set in frequency setting section 19*a*, by means of a key input operation, controller 19, with ALU section 19*b*, commands reference signal generator 10 to generate reference signal fr1=1×50=50 MHz by setting switch SW, of reference signal generator 10, at position n=1, in accordance with the relationship between fv, n, and fr1 as shown in FIG. 2, and commands local oscillator 20 to generate local oscillation signal fL=fv−fr1=520−50=470 MHz, based on $fv=fL+fr1$.

With this operation, the PLL circuit functions such that a phase locked relationship is established between reference signal fr1 and composite signal fr2 (or output signal fv and local oscillation signal fL) at a point where composite signal fr2 has always frequency n×Δf, thereby generating signal having desired frequency fv.

When a 1,070-MHz signal is to be generated, switch SW is set at position n=11 so as to set values as fr1=11×50=550 MHz, and fL=1,070−550=520 MHz.

However, in the signal generating apparatus using the conventional PLL circuit described above, when signals having frequencies with predetermined steps within a relatively wide bandwidth of 520 to 1,070 MHz are substantially continuously generated, the following problem is posed.

Since the number of frequency indexes n of reference signals is increased, a large number of reference signal sources (11 sources in the above example) for a wide frequency bandwidth are required.

This drawback interferes with the demands for a smaller size and lower cost required in current signal generating apparatuses.

One of the reasons why the number of frequency indexes n of reference signals is increased in the signal generating apparatus using the PLL circuit, as described above, is found in the problem of dead band of the phase detector in the PLL circuit. More specifically, this phase detector cannot be operated as a phase detector near the point where the frequency of an output signal from the mixer becomes zero, i.e., between the DC component and the low-frequency component band near substantially a DC component. For this reason, in order to evade this dead band, the PLL circuit must be arranged, as a whole, such that a predetermined frequency displacement is constantly provided so as not to cause an output signal from the mixer to become a DC component. This arrangement increases the number of frequency indexes n of reference signals. As described later, such speculation presents to the inventor of the present invention objects to be achieved. In addition, it is the first step to achieve the objects. Note that these objects include not only a decrease in the number of frequency indexes n of reference signals but also prevention of degradation in purity of signals and frequency stability of a signal generator unit and their improvement, as will be described in detail later.

SUMMARY OF THE INVENTION

It is therefore an object of the present invention to provide a new and improved signal generating apparatus using a PLL circuit which can decrease the number of frequency indexes of reference signals to allow a simple, small, low-cost apparatus, and can maintain excellent purity of signals to be obtained.

According to the present invention, there is provided a signal generating apparatus using a PLL circuit which includes a reference signal generator, a phase detector, a voltage controlled oscillator (VCO), a mixer, and a local oscillator, for generating a signal having a desired frequency within a predetermined frequency bandwidth characterized in that said apparatus further comprises:

switching means for performing a switching operation to connect an output terminal of the phase detector to an input terminal of the VCO in a first state, and connect an output terminal of the mixer to an input terminal of the VCO in a second state; and control means, connected to the switching means, for selectively supplying first and second switching signals to the switch means so as to establish connection relationships corresponding to the first and second states, the control means substantially determining a coincidence between a frequency of an output signal from the VCO and a frequency of a local oscillation signal from the local oscillator so as to generate the first switching signal for establishing the connection relationship corresponding to the first state when a determination result representing a predetermined coincidence is not obtained, and generate the second switching signal for establishing the connection relationship corresponding to the second state when the determination result representing the predetermined coincidence is obtained.

BRIEF DESCRIPTION OF THE DRAWINGS

These and other objects and features of the present invention can be understood through the following embodiments by reference to the accompanying drawings, in which:

FIG. 2 is a view showing an output relationship and the like between reference signals and a voltage controlled oscillator in the apparatus in FIG. 1;

FIG. 4 is a view showing an output relationship and the like between reference signals and a voltage controlled oscillator in the apparatus in FIG. 3;

FIG. 5 is a block diagram of a signal generating apparatus according to another embodiment of the present invention; and FIG. 6 is a flow chart for explaining an operation of the apparatus in FIG. 5.

DETAILED DESCRIPTION OF THE PREFERRED EMBODIMENTS

Figure 1:
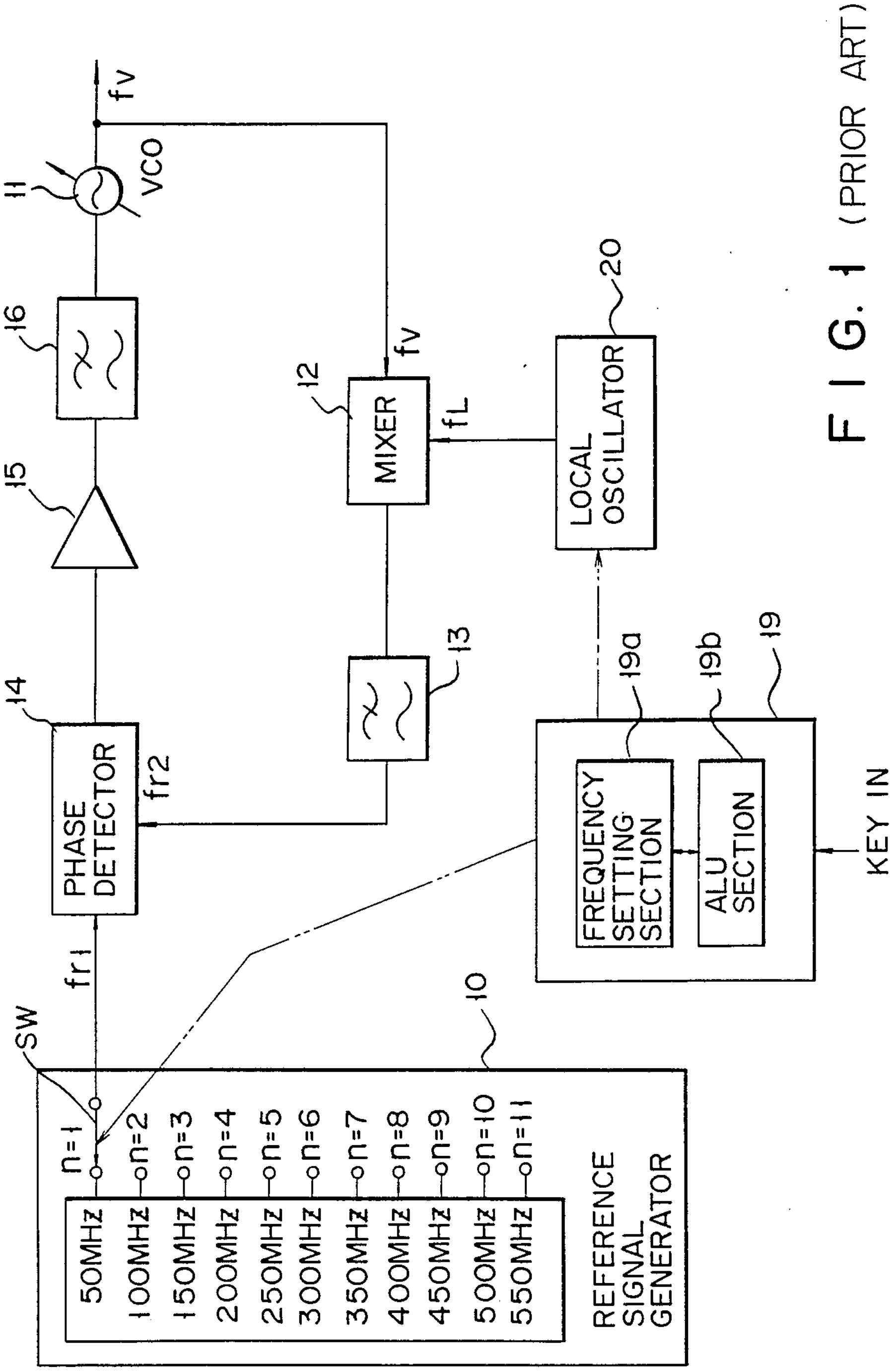
FIG. 1 is a view showing an arrangement of a conventional signal generating apparatus.

The principle of the present invention will be described below. According to the present invention, a PLL type signal generating apparatus is realized with a possibly simple arrangement. The signal generating apparatus continuously generates a signal having a desired frequency with predetermined steps within a relatively wide frequency bandwidth (e.g., 520 to 1,070 MHz). For this purpose, when a relationship between output frequency fv, local oscillation frequency fL, and reference frequency fr1 is given as fv=fL±fr1, an upper side band (USB) or lower side band (LSB) of outputs of a mixer is used with a predetermined frequency of output frequency fv as the center, thereby decreasing frequency range $n \times \Delta f$ of reference signal fr1 and the number of indexes n to about ½ those in the conventional apparatus or less, respectively ($\Delta f$ is a fixed frequency between indexes).

For example, in the above case, when $\Delta f = 50$ MHz and n=1 to 5, reference signal fr1 has a frequency of 50 to 250 MHz, which is about ½ that in the conventional apparatus. However, in this case, local oscillation signal fL is required to have a frequency of 520+50=570 MHz to 1,070−250=820 MHz. As a result, a specific bandwidth becomes as wide as 250 MHz.

If the specific bandwidth of local oscillation signal fL becomes wide in this manner, an arrangement of the local oscillator becomes complicated and bulky, thereby canceling the effect of a decrease in the number of frequency indexes n. In addition, when the specific bandwidth becomes wide, a filtering operation in the local oscillator becomes complicated and purity of the obtained signals and frequency stability are degraded, as will be described later.

Therefore, according to the present invention, a range of n=0 is introduced in frequency index n of a reference signal. Then, a relationship between frequency index n, output signal fv, and reference signal fr1 is established as, e.g., shown in FIG. 4. In addition, since local oscillation signal fL is preferably set in a narrowest bandwidth in substantially a central range of the entire frequency range, it is set at 770 to 820 MHz (a specific bandwidth of 50 MHz) in the above case.

When n=0 in FIG. 4, output signal fv is assigned to an bandwidth of 770 to 820 MHz, which is the same as that of local oscillation signal fL. For this reason, when n=0, an output from the mixer becomes a perfect DC component or a substantially DC (low-frequency) component. In this case, since n=0, reference signal fr1=0.

However, in such a state, as described above, the phase detector in the PLL circuit is inevitably set in the inoperative state due to the dead band.

With this arrangement, when n=0 and a signal obtained by mixing an output signal from the voltage controlled oscillator with a local oscillation signal from the local oscillator, i.e., a DC signal, is output from the mixer to be supplied to the phase detector as a feedback signal, the following problems are posed. Since the phase detector is not operated by a DC signal, a separate circuit capable of performing comparison must be added to the PLL circuit. In addition, a DC reference signal must be output. Moreover, signals including high-frequency to DC signals must be stably transmitted between the mixer and the phase detector. That is, in order to solve these problems, a phase detector, a DC comparator, a reference signal amplifier, and the like must be additionally arranged in the PLL circuit and each constituent circuit must be switched. However, such a solution is not preferable because it makes the circuit arrangement complex.

The present invention has been made in consideration of the various problems described above. According to the present invention, the range for n=0 is introduced in frequency index n of a reference signal, the number of indexes n is reduced to half, and the specific bandwidth of a local oscillation signal is set at a desired value. In this case, according to the present invention, from the fact that the mixer can also be operated as a phase detector, it is found that the problem caused when n=0 can be solved by a simple circuit arrangement. More specifically, the arrangement of the present invention is characterized in that stable signals having desired frequencies with predetermined steps can be substantially continuously generated within a predetermined bandwidth by selectively switching and supplying output signals from the mixer to first and second feedback paths in accordance with switching signals corresponding to set frequencies.

The signal generating apparatus according to the present invention includes, e.g., a voltage controlled oscillator, a mixer for mixing a feedback signal from the voltage controlled oscillator with a local oscillation signal supplied from a local oscillator and variably set in accordance with a setting operation of a frequency setting section, and a phase detector for comparing the phase of an IF output signal from the mixer with that of a reference signal, which is supplied from a reference signal generator and has frequency index n corresponding to the setting operation of the frequency setting section, and for controlling the voltage controlled oscillator using a signal output on the basis of the comparison result, and is characterized by comprising a controller for determining whether frequency index n of the reference signal is in a first state, i.e., n≠0 or in a second state, i.e., n=0 in accordance with the frequency setting operation of the frequency setting section so as to output a switching signal, and a switching unit for selectively switching and supplying the IF output signal from the mixer in the first and second states to the phase detector side and to the voltage controlled oscillator side, respectively, in accordance with the switching signal from the controller. In this case, a conventional balanced modulation type mixer can be used as the mixer.

According to the above-described arrangement, in the first state wherein a signal having a predetermined frequency is output from the mixer as a feedback signal, the switching unit switches the output from the mixer to the phase detector side in accordance with the switching signal from the controller. Then, the phase detector compares the phase of the output from the mixer with that of a reference signal and supplies a signal based on this comparison result to the voltage controlled oscillator so as to control its oscillation frequency. As a result, the voltage controlled oscillator outputs a signal having a desired frequency in the range for $n \neq 0$.

In the second state wherein a DC signal is output from the mixer as a feedback signal, the switching unit switches the output from the mixer to the voltage controlled oscillator side in accordance with the switching signal from the controller. Then, the oscillation frequency of the mixer is controlled by the DC signal from the mixer. As a result, the voltage controlled oscillator outputs a signal having a desired frequency in the range for $n=0$.

A few embodiments of the present invention based on the above-described principle will be described.

Figure 3:
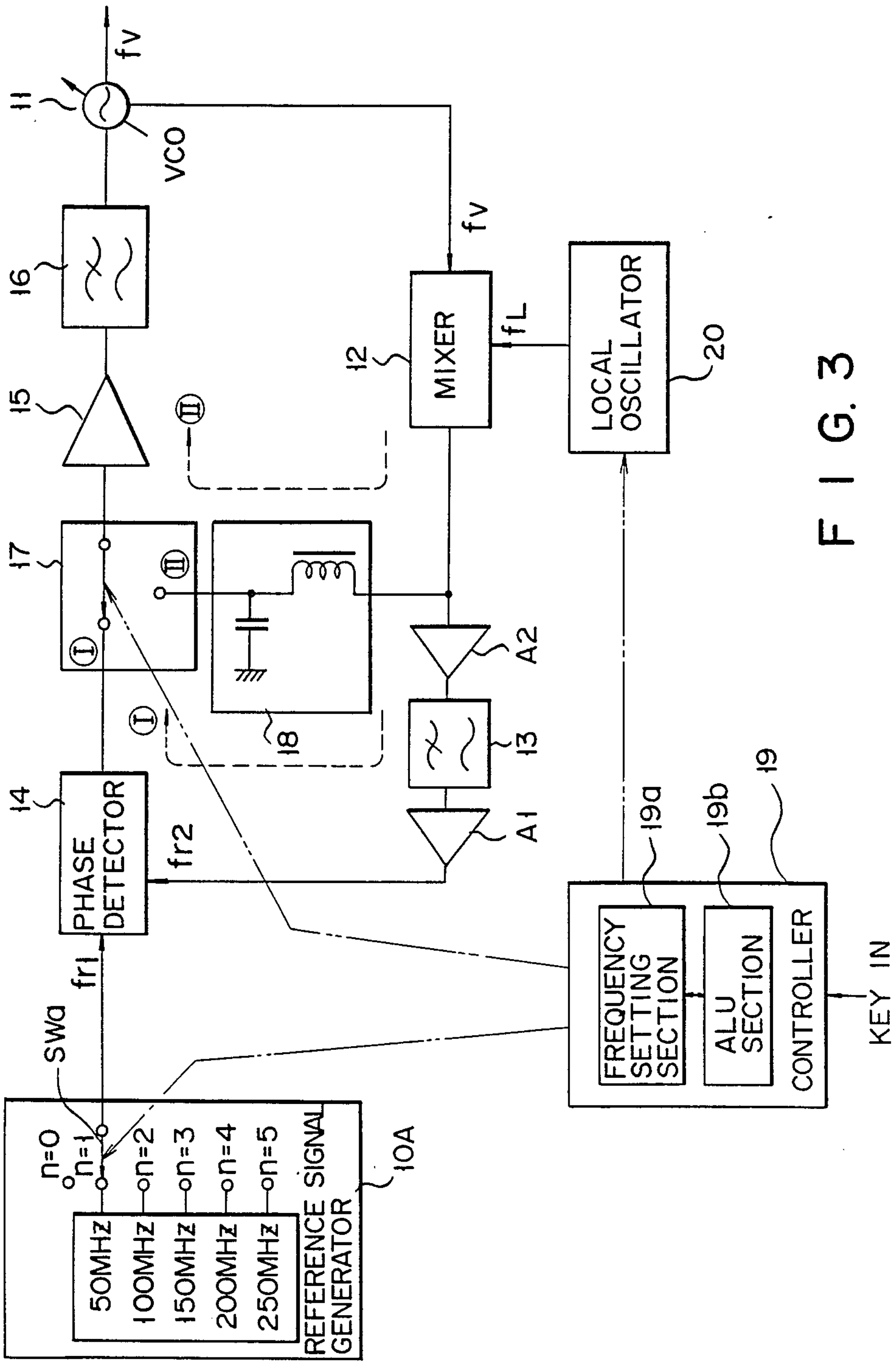
FIG. 3 is a block diagram of a signal generating apparatus according to an embodiment of the present invention.

FIG. 3 is a block diagram of a signal generating apparatus according to a first embodiment of the present invention.

The same reference numerals in this embodiment denote the same constituent elements as in the conventional signal generating apparatus.

A PLL type signal generating apparatus according to this embodiment comprises reference signal generator 10A, phase detector 14, DC amplifier 15, loop (low-pass) filter 16, voltage controlled oscillator 11, mixer 12, low-pass filter 13, switching unit 17, low-pass filter 18, controller 19, and local oscillator 20. An output signal from mixer 12 is selectively switched and supplied to phase detector 14 side or directly to voltage controlled oscillator 11 side by switching unit 17 operated by a switching signal output from controller 19. With this operation, feedback path (I) or (II) is determined, and voltage controlled oscillator 11 substantially continuously generates signals having desired frequencies with predetermined steps within a predetermined frequency bandwidth, e.g., 570 to 1,070 MHz. In this case, the predetermined steps mean a frequency resolution which can be set and is determined in such a manner that setting section 19*a* in controller 19, which will be described in detail later, sets a value of 1 Hz or 10 Hz as a minimum unit of frequency in local oscillator 20 in accordance with, e.g., a key operation.

Phase detector 14 detects each of the phases of composite signal fr2 from mixer 12, which will be described in detail later, and reference signal $fr1 = n \times \Delta f$, which is supplied from reference signal generator 10 and corresponds to a desired frequency set by setting section 19*a* in controller 19 to be described later, and supplies an error signal (a DC voltage signal) proportional to this phase difference to voltage controlled oscillator 11 through switching unit 17, DC amplifier 15, and loop filter 16, thereby controlling the oscillation frequency of voltage controlled oscillator 11.

DC amplifier 15 and loop filter 16 process the low-frequency error signal supplied from phase detector 14 and supply the resultant signal to voltage controlled oscillator 11. In this signal processing, a loop-response damping factor is determined by variable gain control and the filter effect. For example, when the apparatus outputs a signal other than a signal having a desired frequency determined by setting section 19*a* because of noise generated when a switching operation is performed by switching unit 17, DC amplifier 15 and loop filter 16 variably control a loop response speed, a lock range, and the like so as to cause the apparatus to restore the normal operation and output a signal having a desired frequency.

The oscillation frequency of voltage controlled oscillator 11 is controlled by the error signal supplied from phase detector 14 through DC amplifier 15 and loop filter 16. As shown in FIG. 4, voltage controlled oscillator 11 outputs signal $fv = fL \pm fr1 = fL \pm n \times \Delta f$ ($n=0$ to 5) having a desired frequency within a bandwidth of 520 to 1,070 MHz. The signal output from voltage controlled oscillator 11 is supplied to mixer 12 as a feedback signal.

Mixer 12 mixes the feedback signal from voltage controlled oscillator 11 with local oscillation signal fL, which is supplied from local oscillator 20 and corresponds to a desired frequency variably set by setting section 19*a* in controller 19 to be described later. The functions of mixer 12 are selectively switched in accordance with the value of local oscillation signal fL, i.e., substantially the value of frequency index n. More specifically, when $n \neq 0$, mixer 12 functions as a normal mixer for mixing feedback signal fv with local oscillation signal fL, and supplying composite signal fr2 to phase detector 14 through low-pass filter 13. Furthermore, when mixer 12 causes voltage controlled oscillator 11 to output a signal having a desired frequency within a bandwidth of 520 to 770 MHz while inequality $fL < fv$ is satisfied, mixer 12 adds feedback signal fv to local oscillation signal fL. When a signal having a desired frequency is to be output within a bandwidth of 820 to 1,070 MHz while inequality $fL > fv$ is satisfied, mixer 12 subtracts feedback signal fv from local oscillation signal fL. In addition, when $n=0$ ($fL = fv$), mixer 12 compares the phases of feedback signal fv and local oscillation signal fL with each other in the same manner as in phase detector 14, and supplies a signal based on this comparison result to voltage controlled oscillator 11 through low-pass filter 18, switching unit 17, DC amplifier 15, and loop filter 16, thereby controlling the oscillation frequency of voltage controlled oscillator 11. As a result, voltage controlled oscillator 11 outputs a signal having a desired frequency within a bandwidth of 770 to 820 MHz.

Low-pass filter 13 eliminates a high-frequency component of the composite signal supplied from mixer 12 when $n \neq 0$. The composite signal free from high-frequency component is supplied to phase detector 14.

In response to a switching signal from controller 19, switching unit 17 switches the feedback paths in accordance with the value of n. When $n \neq 0$, switching unit 17 performs a switching operation so as to select feedback path (I) in which the output side of phase detector 14 is connected to the input side of voltage controlled oscillator 11, whereas when $n=0$, a switching operation is performed so as to select feedback path (II) in which the output side of mixer 12 is connected to the input side of voltage controlled oscillator 11. In addition, switching unit 17 is normally switched so as to select feedback path (I). When n=0 and a switching signal is supplied from controller 19, switching unit 17 is switched so as to select feedback path (II).

Low-pass filter 18 eliminates a leakage high-frequency component from the signal supplied from mixer 12 when n=0 and supplies the resultant signal to DC amplifier 15 through switching unit 17, thereby minimizing the influence of noise and the like on a high-frequency transmission path.

Controller 19 comprises setting section 19 and ALU section **19*b*. Setting section 19*a* sets the frequency of local oscillation signal fL supplied to mixer 12, and sets the value of n of reference signal $fr1=n\times\Delta f$, which is output by switching the position of switch SWa constituted by, e.g., an analog switch in reference signal generator 10** in accordance with a frequency setting operation. These input setting operations are performed by a ten-key pad or the like (not shown) arranged on a panel of the apparatus.

ALU section **19*b* supplies switching unit 17 constituted by, e.g., an analog switch, with a switching signal for switching feedback path (I) feedback path (II) when setting section 19*a* is set n=0 in accordance with a frequency setting operation. In addition, ALU section 19*b* controls a drive operation of each circuit within the loop. Note that reference symbols A1 and A2 in FIG. 3** respectively denote compensating amplifiers.

In the above-described arrangement, in the case of n≠0 wherein a signal having a desired frequency is to be generated by voltage controlled oscillator 11 within a bandwidth of 520 to 770 MHz, feedback path (I) is set by ALU section **19*b* in accordance with a frequency setting operation, and local oscillation signal fL supplied to mixer 12 and position n (n≧1 to 5: integer) of switch SWa in reference signal generator 10 are variably set by setting section 19*a*. Then, feedback signal fv from voltage controlled oscillator 11 and local oscillation signal fL are added/mixed by mixer 12. The resultant composite signal is supplied to phase detector 14 through low-pass filter 13. Phase detector 14 receives composite signal fr2 and supplies to voltage controlled oscillator 11 an error signal proportional to the phase difference between composite signal fr2 and a reference signal through switching unit 17, DC amplifier 15, and loop filter 16. As a result, the oscillation frequency of voltage controlled oscillator 11** is controlled by the error signal, and a signal having a desired frequency is output within a bandwidth of 520 to 770 MHz.

In the case of n≠0 wherein a signal having a desired frequency is to be generated by voltage controlled oscillator 11 within a bandwidth of 820 to 1,070 MHz, a desired signal can be obtained in the same manner as described above except that a difference between feedback signal fv from voltage controlled oscillator 11 and local oscillation signal fL from local oscillator 20 is calculated by mixer 12.

In the case of n=0 wherein a signal having a desired frequency is to be generated by voltage controlled oscillator 11 within a bandwidth of 770 to 820 MHz, position n=0 of switch SWa in reference signal generator 10 is set by setting section **19*a* while a switching signal is supplied to switching unit 17 through ALU section 19*b*. As a result, feedback path (I) is switched to feedback path (II). In this state, when local oscillation signal fL to be supplied to mixer 12 is variably set, the phases of feedback signal fv from voltage controlled oscillator 11 and local oscillation signal fL are compared with each other in mixer 12. Then, a signal (a DC voltage signal) based on this comparison result is supplied to voltage controlled oscillator 11 through low-pass filter 18, switching unit 17, DC amplifier 15, and loop filter 16. As a result, the oscillation frequency of voltage controlled oscillator 11** is controlled by the above-described DC voltage signal and a signal having a desired frequency in a bandwidth of 770 to 820 MHz is output.

FIG. 5 shows a second embodiment, in which the same reference numerals denote the same constituent elements as in FIG. 3. In this embodiment, low-pass filters 13 and 18, and compensating amplifiers A1 and A2 in FIG. 3, which are not essential elements, are omitted. Local oscillator 20A constitutes a continuous oscillator having Δf width of, e.g., 770 to 820 MHz and includes lower-digit variable synthesizer 201 for outputting a local oscillation signal obtained by interpolating 88 to 138 MHz in 10-Hz steps, and mixer 202. An FM signal from FM source 20B constituted by 600-MHz fixed oscillator 203, 82-MHz FM modulation signal source 204, and mixer 205 is supplied to mixer 202, as needed. An local oscillation signal from local oscillator 20B with such an arrangement is supplied to mixer 12 through 770- to 820 -MHz bandpass filter 21.

FIG. 6 is a flow chart for explaining an operation in FIG. 5. In this case, the contents in FIG. 4 are stored in a memory section in the form of a table in controller 19 constituted by a CPU.

For example, when a 925.5-MHz signal is to be generated, n=3, fr1=150 MHz, and $fL=fv-fr1$ are read out from a table of the memory section. Then, an operation of fL=925.5−150=775.5 MHz is performed in ALU section **19*a* so as to set the value of local oscillation signal fL. In addition, reference signal fr1 is set at 150 MHz, and then switching unit 17** is set to the feedback path (I) side.

Note that instead of storing the contents in FIG. 4 in the internal memory section in the form of a table in advance, controller 19 may performs a predetermined operation using ALU section **19*b***.

A case will be described, wherein for example, the same 922.5-MHz signal as described in the above case is to be generated by an operation scheme. According to the following equations:

$$fL=fv\pm n\times\Delta f \quad (1)$$

$$n=\mathrm{Int}(|fv-fl|/\Delta f) \quad (2)$$

the value of n obtained by equation (2) is substituted for n in equation (1). Note that in equation (1), when fv−fl>0, the sign—is assigned, whereas when fv−fL<0, the sign+is assigned.

In this case, since fv=925.5 MHz, fl=770 MHz, Δf=50 MHz, and n is an integer, $$n=(925.5-770)/50\simeq 3$$

Then, $$fL=925.5-3\times 50\ \mathrm{MHz}$$

Note that frl=n×Δf=150 MHz can be simultaneously calculated.

Furthermore, when a 622.5-MHz signal is to be generated by the operation scheme, ALU section 19b performs the following operations:

$$n=(622.5-770)/50=-3$$

$$fL=622.5+3\times 50=772.5\text{ MHz}$$

ti $fr1=n\times\Delta f=150$ MHz

In the second embodiment, as shown in FIG. 5, the output from lower-digit variable synthesizer 201 and the high-frequency output obtained by mixer 205 are added to each other by mixer 202, thereby obtaining local oscillation signal fL. Therefore, the upper limit oscillation frequency of lower-digit variable synthesizer 201 can be minimized to a low frequency. Consequently, the size of a PLL circuit using the lower-digit synthesizer can be reduced while a lower-digit synthesizer capable of relatively easily increasing the number of set digits can be realized. In addition, since this lower-digit synthesizer is required to perform only interpolation between Δf, the specific bandwidth of the oscillation frequency of the VCO in the PLL circuit used therein can be restricted to two times (actually 1.5 times). As a result, even if variations in constants of parts to be used are considered, a sufficiently stable variable range (specific bandwidth) of the oscillation frequency can be assured.

As in the description on the principle of the present invention, according to the first and second embodiments, since the range for n=0 is introduced in frequency indexes n of reference signals, and frequency indexes n are switched in a step of n×Δf, the specific frequency bandwidth of a local oscillation signal can be restricted to a low value, i.e., Δf=50 MHz. For this reason, an arrangement of a high-frequency filter (specifically, bandpass filter 21) is simplified, and hence a small, low-cost apparatus can be realized in a practical application.

Furthermore, since the specific frequency bandwidth of a local oscillation signal can be decreased, the frequency variable width in VCO 11 can be reduced to a small value, and the V/f sensitivity of VCO 11 can also be restricted to a lower value. Generally, the C/N ratio and frequency stability of an oscillator is closely related to the V/f sensitivity described above. If only a low V/f sensitivity is required, the C/N ratio and the frequency stability can be improved. Therefore, the signal generating apparatus according to the present invention can achieve excellent signal purity and frequency stability in state of non-PLL (free-running state).

As has been described above, according to the signal generating apparatus of the present invention, the switching unit selectively switches an output from the mixer to the phase detector side in the first state, and to the voltage controlled oscillator side in the second state in response to a switching signal from the controller in accordance with a frequency setting operation, and hence the output from the mixer can be switched to the first or second feedback path. As a result, even if any signal from a high-frequency signal to a DC signal is output from the mixer, stable signals having desired frequencies with predetermined steps can be continuously generated within a predetermined bandwidth while high purity and excellent frequency stability of the signals are maintained.

In addition to the simple arrangement described above, since the signal generating apparatus utilizes the fact that the mixer can be operated as a phase detector, the apparatus can be maximally simplified and realized at low cost without complicating the circuit arrangement.

What is claimed is:

1. A signal generating apparatus using a PLL circuit which includes a reference signal generator, a phase detector, a voltage controlled oscillator (VCO), a mixer, and a local oscillator, for generating a signal having a desired frequency within a predetermined frequency bandwidth, that said apparatus further comprising:

switching means for performing a switching operation to connect an output terminal of said phase detector to an input terminal of said VCO in a first state, and to connect an output terminal of said mixer to an input terminal of said VCO in a second state; and control means, connected to said switching means, for selectively supplying first and second switching signals to said switch means so as to establish connection relationships corresponding to the first and second state, said control means including means for substantially determining a coincidence between a frequency of an output signal from said VCO and a frequency of a local oscillation signal from said local oscillator, so as to generate the first switching signal for establishing the connection relationship corresponding to the first state when a determination result representing a predetermined coincidence is not obtained, and to generate the second switching signal for establishing the connection relationship corresponding to the second state when the determination result representing the predetermined coincidence is obtained.

2. An apparatus according to claim 1, wherein said control means includes means for determining the coincidence in accordance with the desired frequency and means for setting a frequency of a reference signal from said reference signal generator and a frequency of a local oscillation signal from said local oscillator to respective predetermined values.

3. An apparatus according to claim 2, wherein said control means includes a memory section for storing contents necessary for setting the frequencies of the reference signal and the local oscillation signal.

4. An apparatus according to claim 2, wherein said control means includes an ALU section for performing an operation necessary for setting the frequencies of the reference signal and the local oscillation signal.

5. An apparatus according to claim 2, wherein the predetermined frequency bandwidth is divided into a plurality of bandwidths, i.e., (2n+1) (n is an integer), and said reference signal generator includes means for generating a signal having a frequency switched in a predetermined number of steps commonly used for every corresponding two ranges sandwiching a central range of the divided bandwidths.

6. An apparatus according to claim 1, wherein said switching means includes analog switch means.

7. An apparatus according to claim 5, wherein said reference signal generator includes a reference signal switch having at least contacts corresponding to the predetermined number of steps.

8. An apparatus according to claim 7, wherein said reference signal switch includes an analog switch.

9. An apparatus according to claim 2, wherein said local oscillator includes a lower-digit variable synthesizer controlled by said control means.

10. An apparatus according to claim 9, wherein said lower-digit variable synthesizer is variably controllable in a frequency range equal to a frequency range between the steps of the reference signals.

* * * * *